(12) United States Patent
Kwak et al.

(10) Patent No.: US 11,422,658 B2
(45) Date of Patent: Aug. 23, 2022

(54) ELECTRODE STRUCTURE AND TOUCH DETECTING SENSOR USING THE SAME

(71) Applicant: SAMSUNG ELECTRONICS CO., LTD., Suwon-si (KR)

(72) Inventors: Chan Kwak, Gyeonggi-do (KR); Jae-Young Choi, Suwon-si (KR); Kwang Hee Kim, Seoul (KR); Jong Wook Roh, Anyang-si (KR); Hyeon Cheol Park, Hwaseong-si (KR); Weon Ho Shin, Busan (KR); Yun Sung Woo, Yongin-si (KR); Hyosug Lee, Suwon-si (KR); Jinyoung Hwang, Incheon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/917,912

(22) Filed: Jul. 1, 2020

(65) Prior Publication Data

US 2020/0333827 A1    Oct. 22, 2020

Related U.S. Application Data

(63) Continuation of application No. 14/802,599, filed on Jul. 17, 2015, now abandoned.

(30) Foreign Application Priority Data

Jul. 18, 2014 (KR) .................. 10-2014-0091127

(51) Int. Cl.
*G06F 3/041* (2006.01)
*G06F 3/044* (2006.01)
(Continued)

(52) U.S. Cl.
CPC .......... *G06F 3/04164* (2019.05); *G06F 1/16* (2013.01); *G06F 3/044* (2013.01); *G06F 3/0416* (2013.01);
(Continued)

(58) Field of Classification Search
CPC .............. G06F 3/041–048; G06F 1/16; G06F 3/044–0448; G06F 3/0416
See application file for complete search history.

(56) References Cited

U.S. PATENT DOCUMENTS 5,747,222 A    5/1998    Ryu
5,995,359 A    11/1999   Klee et al.
(Continued)

FOREIGN PATENT DOCUMENTS

CN    1155158 A      7/1997
CN    102486917 A    6/2012
(Continued)

OTHER PUBLICATIONS

Korean Office Action—Korean Patent Application No. 10-2014-0091127 dated Sep. 21, 2020.
(Continued)

*Primary Examiner* — Hang Lin
(74) *Attorney, Agent, or Firm* — Cantor Colburn LLP

(57) ABSTRACT

An electrode structure includes: a first nonconductive layer; a first conductive layer disposed on the first nonconductive layer; a second nonconductive layer disposed on the first conductive layer; a second conductive layer disposed on the second nonconductive layer; and a third nonconductive layer disposed on the second conductive layer, where at least one of the first conductive layer and the second conductive layer includes a two-dimensional conductive material.

15 Claims, 7 Drawing Sheets

(51) Int. Cl.
  *G06F 1/16*   (2006.01)
  *H05K 1/02*   (2006.01)
  *H05K 1/09*   (2006.01)

(52) U.S. Cl.
  CPC .......... *G06F 3/0445* (2019.05); *G06F 3/0446* (2019.05); *H05K 1/0274* (2013.01); *H05K 1/0298* (2013.01); *H05K 1/09* (2013.01); *G06F 2203/04103* (2013.01)

(56) References Cited

U.S. PATENT DOCUMENTS

| | | | |
|---|---|---|---|
| 7,585,349 | B2 | 9/2009 | Xia et al. |
| 8,728,358 | B2 | 5/2014 | Ikisawa et al. |
| 8,730,184 | B2 | 5/2014 | Nirmal et al. |
| 9,182,640 | B2 | 11/2015 | Bae et al. |
| 9,835,913 | B2 | 12/2017 | Pellerite et al. |
| 10,101,617 | B2 | 10/2018 | Pellerite et al. |
| 2002/0042201 | A1* | 4/2002 | Willis ................ H01L 21/7688 438/692 |
| 2004/0099438 | A1 | 5/2004 | Arthur et al. |
| 2006/0274047 | A1 | 12/2006 | Spath et al. |
| 2008/0124580 | A1* | 5/2008 | Musashi ................ G11B 5/54 428/810 |
| 2010/0200286 | A1 | 8/2010 | Melcher et al. |
| 2010/0244655 | A1 | 9/2010 | Kim et al. |
| 2011/0123866 | A1 | 5/2011 | Pan et al. |
| 2011/0139516 | A1* | 6/2011 | Nirmal ................ G06F 3/0446 178/18.01 |
| 2011/0279409 | A1* | 11/2011 | Salaverry ............ G06F 3/04164 345/174 |
| 2011/0291994 | A1 | 12/2011 | Kwalk et al. |
| 2011/0298728 | A1 | 12/2011 | Kim et al. |
| 2012/0146919 | A1 | 6/2012 | Kim et al. |
| 2012/0153236 | A1 | 6/2012 | Cakmak et al. |
| 2012/0300168 | A1 | 11/2012 | Hoke |
| 2013/0181910 | A1 | 7/2013 | Yilmaz et al. |
| 2013/0241855 | A1 | 9/2013 | Kim |
| 2013/0328051 | A1* | 12/2013 | Franklin ................ H05K 1/028 257/59 |
| 2014/0022188 | A1 | 1/2014 | Ahn |
| 2015/0248058 | A1 | 9/2015 | Tanabe et al. |

FOREIGN PATENT DOCUMENTS

| | | |
|---|---|---|
| CN | 102667691 A | 9/2012 |
| CN | 103576954 A | 2/2014 |
| JP | 2008310551 A | 12/2008 |
| JP | 2011253519 | 12/2011 |
| JP | 2013514589 A | 4/2013 |
| JP | 2013218648 A | 10/2013 |
| JP | 2014071484 | 4/2014 |
| KR | 1020110120121 A | 11/2011 |
| KR | 1020110131957 | 12/2011 |
| KR | 1020110133840 A | 12/2011 |
| KR | 1020120104326 | 9/2012 |
| KR | 1020130104300 A | 9/2013 |
| KR | 1020130107460 A | 10/2013 |
| KR | 1020140024376 | 2/2014 |
| WO | 2010119687 A1 | 10/2010 |
| WO | 2012040637 | 3/2012 |
| WO | 2014054530 | 4/2014 |

OTHER PUBLICATIONS

Decision of Refusal—Japanese Patent Application No. 2015-140748 dated Jul. 30, 2019.
Chinese Office Action for corresponding Chinese Patent Application No. 201510422696.1 dated Oct. 8, 2018.
Japanese Office Action for corresponding Japanese Patent Application No. 2015-140748 dated Dec. 4, 2018.
European Office Action—European Application No. 15177454.4 dated Jan. 11, 2017.
"What is graphene? Here's what you need to know about a material that could be the next silicon",(Copyright 2015), pp. 1-12, Retrieved from the internet Nov. 20, 2015, <URL:https://gigaom.com/2013/07/15/what-is-graphene-heres-what-you-need-to-know-about.
Extended European Search Report—European Patent Application No. 15177454.4 dated Dec. 8, 2015.

* cited by examiner

ELECTRODE STRUCTURE AND TOUCH DETECTING SENSOR USING THE SAME

RELATED APPLICATIONS

This application is a continuation application of U.S. patent application Ser. No. 14/802,599, filed on Jul. 17, 2015, which claims priority to Korean Patent Application No. 10-2014-0091127 filed on Jul. 18, 2014, and all the benefits accruing therefrom under 35 U.S.C. § 119, the content of which in its entirety is herein incorporated by reference.

BACKGROUND

1. Field

The disclosure relates to an electrode structure and a touch detecting sensor including the electrode structure.

2. Description of the Related Art

Electrodes having various shapes and functions are used in many electrical and electronic devices such as, but not limited to, for example, a display device. These electrodes include a transparent electrode providing sufficient transparency to transmit light, together with excellent conductivity. The material of the transparent electrode includes indium tin oxide ("ITO"), tin oxide ($SnO_2$), zinc oxide (ZnO), or the like. Since ITO has insufficient flexibility, and a price rise is unavoidable due to the limited indium reserves, a substitute material thereof is desired to be developed. The tin oxide ($SnO_2$) and the zinc oxide (ZnO) also have insufficient conductivity and unfavorable flexibility.

Recently, a touch detection function for interacting with a user in addition to an image display function have been widely incorporated together in a flat panel display such as, but not limited to, for example, a liquid crystal display ("LCD"), an organic light emitting diode display ("OLED"), and an electrophoretic display. The touch detection function is typically used to notify touch information of whether an object (e.g., a finger of a user or a touch pen) approaches or touches a screen of a display by detecting a change of pressure, charge, light, or the like on the display when the user approaches or touches the display using his/her finger or the touch pen to write a letter or to draw a picture. The display device may receive a video signal and display an image based on the touch information.

The touch detection function may be accomplished by the touch detecting sensor. The touch detecting sensor may be classified into a resistive type, a capacitive type, an electromagnetic type ("EM"), an optical type, or the like according to the various methods.

For example, the capacitive type of touch detecting sensor includes a detection capacitor including a plurality of detection electrodes that transfers a detection signal, and detects a capacitance change and/or a charge change of the detection capacitor generated when a conductive material such as a finger approaches the touch detecting sensor, to notify whether and where a touch occurs. The capacitive type of touch detecting sensor includes a plurality of touch electrodes disposed in the touch detecting region, and a signal transmission wire connected to the touch electrode. The signal transmission wire may deliver a detection input signal to the touch electrode or may deliver a detection output signal of the touch electrode generated by a touch to a detection signal controller.

SUMMARY

A transparent electrode is widely used in a touch detecting sensor, and the transparent electrode is desired to have high transparency and low sheet resistance. In a touch detecting sensor for a flexible display device, the transparent electrode is also desired to be highly flexible. However, a conventional transparent electrode material such as indium tin oxide ("ITO") may not have such desired characteristics.

In an exemplary embodiment, an electrode structure includes: a first nonconductive layer; a first conductive layer disposed on the first nonconductive layer; a second nonconductive layer disposed on the first conductive layer; a second conductive layer disposed on the second nonconductive layer; and a third nonconductive layer disposed on the second conductive layer. In such an embodiment, at least one of the first conductive layer and the second conductive layer includes a two-dimensional conductive material.

In an exemplary embodiment, each of the first conductive layer and the second conductive layer may include a conductive material including the two-dimensional conductive material, a silver nanowire, graphene, a carbon nanotube, a metal mesh or a combination thereof.

In an exemplary embodiment, the conductive material of the first conductive layer and the conductive material of the second conductive layer may be different from each other.

In an exemplary embodiment, a part of the conductive material of the first conductive layer or the second conductive layer may be disposed in the second nonconductive layer.

In an exemplary embodiment, the first nonconductive layer, the second nonconductive layer and the third nonconductive layer may include a binder which is wet-coated with the conductive material of the first conductive layer or the second conductive layer.

In an exemplary embodiment, the two-dimensional conductive material may include an alkaline metal suboxide, an alkaline metal subcarbide, an alkaline-earth metal subnitride, a transition metal subcarbide, a transition metal suboxide, a transition element-rich chalcogenide, a transition metal-containing subhalide, a boride compound, an oxide or a combination thereof.

In an exemplary embodiment, the electrode structure may further include an anti-reflection coating disposed between the first conductive layer and the second conductive layer, and the anti-reflection coating may have a refractive index in a range of about 1.6 to about 1.8 and a thickness in a range of about 75 nanometers (nm) to about 95 nm.

In an exemplary embodiment, the third nonconductive layer may include a lower layer including the binder and an overcoat layer including a polyacrylate-based material.

In an exemplary embodiment, the electrode structure may further include a third conductive layer disposed on the third nonconductive layer and a fourth nonconductive layer disposed on the third conductive layer.

In an exemplary embodiment, the third conductive layer may include a two-dimensional conductive material, a silver nanowire, a metal mesh, a carbon nanotube, graphene or a combination thereof, and the fourth nonconductive layer may include a binder which is wet-coated with the conductive material of the third conductive layer.

In an exemplary embodiment, the fourth nonconductive layer may include a lower layer including the binder and an overcoat layer including a polyacrylate-based material.

In an exemplary embodiment, the electrode structure may further include a conductive connector disposed on a surface of a stacking structure including the first nonconductive layer, the first conductive layer, the second nonconductive layer, the second conductive layer, and the third nonconductive layer, where the conductive connector is electrically connected to the first conductive layer and the second conductive layer.

In an exemplary embodiment, the conductive connector may include the conductive material of the first conductive layer, the conductive material of the second conductive layer, molybdenum (Mo), silver (Ag), titanium (Ti), copper (Cu), aluminum (Al), molybdenum/aluminum/molybdenum (Mo/Al/Mo) or a combination thereof.

In an exemplary embodiment, a touch detecting sensor includes: a plurality of first touch electrodes arranged substantially in a first direction; a plurality of second touch electrodes arranged substantially in a second direction crossing the first direction; and a touch controller connected to the plurality of first touch electrodes and the plurality of second touch electrodes, where the touch controller applies a detection input signal, and receives a detection output signal to detect a touch on the first and second touch electrodes, where each of the first touch electrodes and the second touch electrodes include a stacking structure, in which a plurality of conductive layers and a plurality of nonconductive layers are alternately stacked one on another, and the conductive layers include a two-dimensional conductive material.

In an exemplary embodiment, the plurality of conductive layers may respectively include at least one of a conductive material including a two-dimensional conductive material, a silver nanowire, graphene, a carbon nanotube, a metal mesh or a combination thereof.

In an exemplary embodiment, the two-dimensional conductive material may include an alkaline metal suboxide, an alkaline metal subcarbide, an alkaline-earth metal subnitride, a transition metal subcarbide, a transition metal suboxide, a transition element-rich chalcogenide, a transition metal-containing subhalide, a boride compound, an oxide or a combination thereof.

In an exemplary embodiment, the nonconductive layers may include a binder which is wet-coated with the conductive material of the plurality of conductive layers.

In an exemplary embodiment, the touch detecting sensor may further include a conductive connector disposed on a surface of the stacking structure, where the conductive connector is electrically connected to the conductive layers.

In an exemplary embodiment, the conductive connector may cover a part of an upper surface of the stacking structure and a side surface of the stacking structure.

In an exemplary embodiment, the conductive connector may be connected to a wire which connects the first touch electrodes and the second touch electrodes to the touch controller.

DETAILED DESCRIPTION

Figure 1:
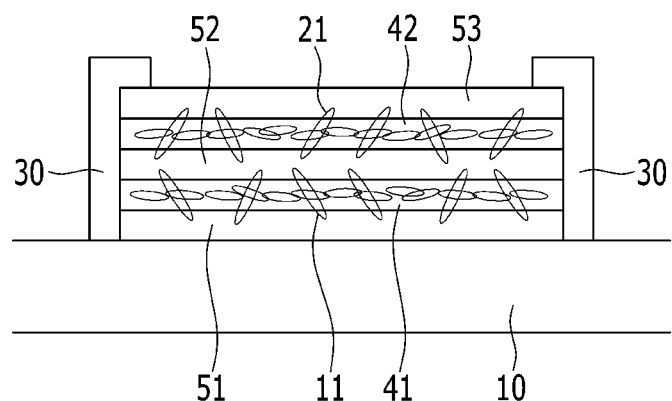
FIGS. 1 to 3 are cross-sectional views of exemplary embodiments of an electrode structure

The embodiments will be described more fully hereinafter with reference to the accompanying drawing. As those skilled in the art would realize, the described embodiments may be modified in various different ways, all without departing from the spirit or scope of this disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of this disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example in an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification.

Hereinafter, exemplary embodiments will be described in further detail with reference to the accompanying drawings.

First, an exemplary embodiment of the electrode structure will be described with reference to FIGS. 1 to 3.

FIG. 1 shows an exemplary embodiment of the electrode structure including a stacking structure, in which a first nonconductive layer 51, a first conductive layer 41, a second nonconductive layer 52, a second conductive layer 42, a third nonconductive layer 53 are sequentially disposed on a substrate 10, and a conductive connecting member (also referred to as a "conductive connector") 30 disposed on a side surface of the stacking structure. The first conductive layer 41 includes a first conductive material 11, and the second conductive layer 42 includes a second conductive material 21.

In an exemplary embodiment, at least one of the first conductive material 11 and the second conductive material 21 includes a two-dimensional conductive material, and the remaining one includes a transparent conductive material such as a two-dimensional conductive material, a silver nanowire ("AgNw"), a metal mesh, a carbon nanotube ("CNT"), graphene, and the like, for example. In such an embodiment, the two-dimensional conductive material is a conductive material including an alkaline metal suboxide, an alkaline metal subcarbide, an alkaline-earth metal subnitride, a transition metal subcarbide, a transition metal suboxide, a transition element-rich chalcogenide, a transition metal-containing subhalide, a boride compound, an oxide, or the like, for example. In such an embodiment, the alkaline metal may include Cs, Rb, K, Na or a combination thereof, the alkaline-earth metal may include Ca, Mg, Sr, Ba or a combination thereof, and the transition metal may include Sc, Y, Ti, Zr, Hf, V, Nb, Ta, Cr, Mo, W, Mn, Tc, Re, Ag or a combination thereof. The alkaline metal suboxide may be represented by $A_3O$, $A_2O$, $A_6O$, or $A_7O$ (where A is Cs, Rb, K, Na or a combination thereof). The alkaline-earth metal subnitride may be represented by $AE_2N$ (where AE is Mg, Sr, Ba or a combination thereof), or $AE_3N$ (where AE is Mg, Ca, Sr, Ba or a combination thereof). The transition element subcarbide may be represented by $M_2C$ or $M_4C$ (where M is Sc, Y, Ti, Zr, Hf, V, Nb, Ta, Cr, Mo, W, Mn, Tc, Re, Ag or a combination thereof). The transition element-rich chalcogenide may be a transition metal-rich chalcogenide. The transition metal-rich chalcogenide may be represented by $M_3E_2$, $M_2E$, $M_5E$, $M_4E_3$, or ME, (where M is Sc, Y, Ti, Zr, Hf, V, Nb, Ta, Cr, Mo, W, Mn, Tc, Re, Ag or a combination thereof, and E is S, Se, or Te). The transition element-containing subhalide may be represented by $M_2X$ or MX (where M is Sc, Y, Ti, Zr, Hf, V, Nb, Ta, Mn, Tc, Re, Ag or a combination thereof, and X is F, Cl, Br, or I). The boride compound may include $AuB_2$, $AlB_2$, $AgB_2$, $MgB_2$, $TaB_2$, $NbB_2$, $YB_2$, $WB_2$, $VB_2$, $MoB_2$, $ScB_2$ or a combination thereof. The oxide may include $RuO_2$, and the like. In an exemplary embodiment, the two-dimensional conductive material may include a repeating unit structure including at least two metal atom layers, and a two-dimensional electron gas layer between repeating unit structures.

In such an embodiment, at least one of the first conductive material 11 and the second conductive material 21 includes a two-dimensional conductive material, such that the flexibility of the electrode structure including a stacking structure is improved.

The conductive connecting member 30 may include a low resistance material such as molybdenum (Mo), silver (Ag), titanium (Ti), copper (Cu), aluminum (Ti), and molybdenum/aluminum/molybdenum (Mo/Al/Mo), for example, or a conductive material included in the first conductive layer 41 or the second conductive layer 42.

In an exemplary embodiment, a part of the first conductive material 11 may extend to the first nonconductive layer 51 or the second nonconductive layer 52 from a boundary surface between the first conductive layer 41 and the first nonconductive layer 51 or between the first conductive layer 41 and the second nonconductive layer 52, or a part of the second conductive material 21 may extend to the second nonconductive layer 52 or the third nonconductive layer 53 from a boundary planar surface between the second conductive layer 42 and the second nonconductive layer 52 or between the second conductive layer 42 and the third nonconductive layer 53. Accordingly, in such an embodiment, extending portions of the first conductive material 11 and the second conductive material 21 may contact each other in the second nonconductive layer 52, such that the first conductive layer 41 and the second conductive layer 42 may be electrically connected to each other. In an alternative exemplary embodiment, the first conductive material 11 and the second conductive material 21 may not contact each other, and the first conductive material 11 and the second conductive material 21 may be connected to each other via the conductive connecting member 30.

Hereinafter, an exemplary embodiment of a method of forming the electrode structure having a structure described above will now be described. In an exemplary embodiment, the first conductive material 11 is mixed with a first binder and coated (e.g., wet-coated) on the substrate 10 in a predetermined thickness and dried, then a nonconductive material for the first binder defines the first nonconductive layer 51 and a part of the second nonconductive layer 52, and the middle portion where the first conductive material 11 is dominantly or mainly distributed defines the first conductive layer 41. In such an embodiment, the second conductive material 21 is mixed with a second binder and coated (e.g., wet-coated) thereon and dried, then an nonconductive material for the second binder defines the remaining part of the second nonconductive layer 52 and a part of the third nonconductive layer 53, and the middle portion where the second conductive material 21 is dominantly or mainly distributed defines the second conductive layer 42. In such an embodiment, the first conductive material 11 and the second conductive material 21 may not be uniformly distributed, such that a part of the first conductive material 11 and the second conductive material 21 may intrude into the adjacent nonconductive layer. Accordingly, in such an embodiment, a part of the first conductive material 11 may be exposed by the second nonconductive layer 52, and the part of the first conductive material 11 may contact a part of the second conductive material 21, such that the first conductive layer 41 and the second conductive layer 42 may be electrically connected to each other. In such an embodiment, a hole may be defined through the second nonconductive layer 52, and a part of the first conductive material 11 or the second conductive material 21 may be disposed in the hole such that the first conductive material 11 may be connected to the second conductive material 21. In such an embodiment, where the first conductive material 11 is connected to the second conductive material 21, the flexibility of the stacking structure may be improved.

In such an embodiment, a binder for forming at least a part of the first nonconductive layer 51, the second nonconductive layer 52 and the third nonconductive layer 53 may include a cellulose-based binder such as hydroxypropyl methylcellulose ("HPMC"), polyvinyl alcohol, polyvinyl acrylic acid or a combination thereof. The third nonconductive layer 53 may be defined by a portion formed by a second binder and a portion formed by an overcoating material separately stacked thereon. The overcoating material for the third nonconductive layer 53 may include a polyacrylate-based material, for example.

According to an exemplary embodiment, as shown in FIG. 1, the electrode structure may include two conductive layers and three nonconductive layers, but not being limited thereto. In an alternative exemplary embodiment, the number of conductive layers and nonconductive layers may be greater than or equal to 3.

Figure 2:
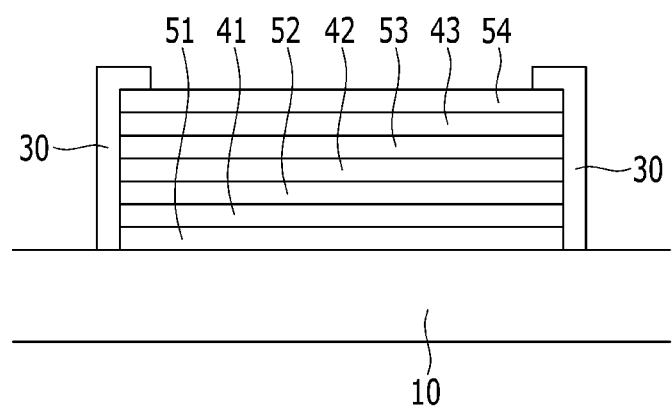

Referring to FIG. 2, in an alternative exemplary embodiment of an electrode structure, a first nonconductive layer 51, a first conductive layer 41, a second nonconductive layer 52, a second conductive layer 42, a third nonconductive layer 53, a third conductive layer 43 and a fourth nonconductive layer 54 are sequentially disposed on a substrate 10. In such an embodiment, a conductive connecting member 30 is disposed on a side surface of the stacking structure to electrically connect the first conductive layer 41, the second conductive layer 42 and the third conductive layer 43 to each other. The conductive connecting member 30 may extend to contact a part of the upper surface of the fourth nonconductive layer 54, which may be the uppermost layer of the stacking structure, as well as the side surface of the stacking structure.

The substrate 10 may define a basal member (e.g., a base layer) of the stacking structure, and may be a nonconductive layer. The substrate 10 may include or be formed of plastic or glass, for example. A material of the substrate 10 may be determined based on the configuration of the device employing the electrode structure.

In such an embodiment, at least one of the first conductive layer 41, the second conductive layer 42 and the third conductive layer 43 may include the two-dimensional conductive material. In one exemplary embodiment, for example, one of the first conductive layer 41, the second conductive layer 42 and the third conductive layer 43 may be a layer including the two-dimensional conductive material, and the remaining two may be layers including the two-dimensional conductive material, an AgNw, a metal mesh, a CNT, graphene or a combination thereof. In such an embodiment, the first conductive layer 41, the second conductive layer 42 and the third conductive layer 43 may include one of various combinations of conductive materials, e.g., the conductive materials described above. The conductive materials of the first conductive layer 41, the second conductive layer 42 and the third conductive layer 43 may be different from each other. In one exemplary embodiment, for example, where the first conductive layer 41 includes the two-dimensional conductive material, the second conductive layer 42 may include an AgNw, and the third conductive layer 43 may include a CNT, graphene or a metal mesh. In one exemplary embodiment, for example, the first conductive layer 41 includes graphene, the second conductive layer 42 includes a two-dimensional conductive material, and the third conductive layer 43 includes a CNT, a metal mesh, AgNw or a combination thereof. The conductive materials of the first conductive layer 41, the second conductive layer 42 and the third conductive layer 43 may include different two-dimensional conductive materials from each other. The first conductive layer 41, the second conductive layer 42 and the third conductive layer 43 may each include a combination of conductive materials. In one exemplary embodiment, for example, the first conductive layer 41, the second conductive layer 42 and the third conductive layer 43 may each include a combination of the AgNw and the two-dimensional conductive material or a combination of the two-dimensional conductive material, AgNw and graphene. In an exemplary embodiment, the first conductive layer 41, the second conductive layer 42 and the third conductive layer 43 may include different combination of conductive materials. In one exemplary embodiment, for example, the first conductive layer 41 may include an AgNw, the second conductive layer 42 may include an AgNw and graphene, and the third conductive layer 43 may include the two-dimensional conductive material and a CNT or a metal mesh. In one alternative exemplary embodiment, for example, the first conductive layer 41 may include graphene and the two-dimensional conductive material, the second conductive layer 42 may include an AgNw and the two-dimensional conductive material, and the third conductive layer 43 may include graphene and a metal mesh or the two-dimensional conductive material.

The first nonconductive layer 51, the second nonconductive layer 52, the third nonconductive layer 53 and the fourth nonconductive layer 54 may include a binder, which is mixed with the material for the first conductive layer 41, the second conductive layer 42 and the third conductive layer 43, and coated. The binder may include a cellulose-based binder such as HPMC, polyvinyl alcohol, polyvinyl acrylic acid, or the like. The fourth nonconductive layer 54 may be defined by a portion formed by the binder and a portion formed by the overcoating material separately stacked thereon. The overcoating material for the fourth nonconductive layer 54 may include a polyacrylate-based material, for example.

In an exemplary embodiment, the conductive connecting member 30 may include the conductive material included in the first conductive layer 41, the second conductive layer 42 or the third conductive layer 43, or a low resistance material such as molybdenum (Mo), silver (Ag), titanium (Ti), copper (Cu), aluminum (Ti), molybdenum/aluminum/molybdenum (Mo/Al/Mo) and the like.

In an exemplary embodiment, the second nonconductive layer 52 may cover the entire first conductive layer 41 therebelow, or may cover a part of the first conductive layer 41. In an exemplary embodiment, the third nonconductive layer 53 may cover the entire second conductive layer 42 therebelow, or may cover a part of the second conductive layer 42. In such an embodiment, the first conductive layer 41 and the second conductive layer 42 may contact each other and be electrically connected to each other, and the second conductive layer 42 and the third conductive layer 43 may contact each other and be electrically connected to each other.

The first nonconductive layer 51, the second nonconductive layer 52, the third nonconductive layer 53 and the fourth nonconductive layer 54 may include a single layer including the binder, but not being limited thereto. In an alternative exemplary embodiment, the first nonconductive layer 51, the second nonconductive layer 52, the third nonconductive layer 53 and the fourth nonconductive layer 54 may include a dielectric layer and a layer including the binder.

Figure 3:
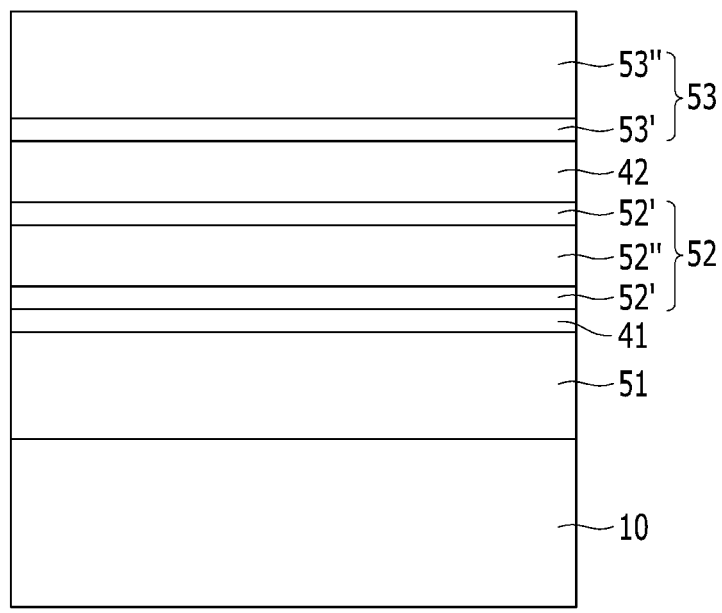

Referring to FIG. 3, in another alternative exemplary embodiment of an electrode structure, the first nonconductive layer 51, the first conductive layer 41, the second nonconductive layer 52, the second conductive layer 42 and the third nonconductive layer 53 are sequentially disposed on the substrate 10. In such an embodiment, a conductive connecting member (not shown) is disposed on the side surface of the stacking structure. In such an embodiment, the conductive connecting member electrically connected to the first conductive layer 41 and the second conductive layer 42 to connect the first conductive layer 41 with the second conductive layer 42.

In such an embodiment, as shown in FIG. 3, the second nonconductive layer 52 may include two binder films 52' disposed opposite to each other, and an anti-reflection coating 52" disposed between the two binder films 52'. In such an embodiment, as shown in FIG. 3, the third nonconductive layer 53 includes a binder film 53' disposed on the second conductive layer 42 and an overcoat layer 53" disposed on the binder film 53'.

The anti-reflection coating 52" is a layer that reduces light reflection on the interface between a plurality of layers having different refractive indexes while transmitting light through the electrode structure, and the refractive index and the thickness of the anti-reflection coating 52" may be determined based on the thickness and refractive index of layers of the electrode structure. According to an exemplary embodiment, the anti-reflection coating 52" may include a transparent dielectric material having a refractive index (n) of about 1.7 and may have a thickness of about 85 nanometers (nm). In such an embodiment, the nonconductive layers of the electrode structure may include a polycarbonate film having a refractive index of about 1.59, a HPMC binder having a refractive index of about 1.55, and a urethane acrylate overcoat layer having a refractive index of about 1.47. In such an embodiment, the conductive layer has different refractive indexes according to the wavelength. The anti-reflection coating 52" may be provided by stacking the transparent dielectric material having a refractive index (n) in a range of about 1.6 to about 1.8 to have a thickness in a range of about 75 nm to about 95 nm.

The following Table 1 compares sheet resistance and haze of one exemplary embodiment of an electrode structure, where one of two conductive layers 41 and 42 is formed with AgNw and the other of the two conductive layers 41 and 42 is formed with $RuO_2$, which is one of two-dimensional conductive materials, (hereinafter, such an electrode structure will be referred to as "composite electrode structure") with each of an AgNw single layer and a $RuO_2$ single layer. The thickness of the AgNw layer of the composite electrode structure is about 40 nm, and the thickness of the $RuO_2$ layer of the composite electrode structure is less than or equal to about 10 nm

TABLE 1

|  | Sheet resistance (ohm/sq) | Haze (%) |
|---|---|---|
| AgNw | 50 | 1.0 |
| Two-dimensional conductive material ($RuO_2$) | 50 | 0.0 |
| Composite electrode structure | 25 | 1.0 |

As shown in Table 1, the composite electrode structure, in which the AgNw layer and the $RuO_2$ layer are stacked together with nonconductive layers and parallel-connected to each other, has less sheet resistance than the AgNw single layer or the $RuO_2$ single layer, and the haze of the composite electrode structure is substantially the same as the haze of the AgNw single layer. Accordingly, an exemplary embodiment, where the electrode structure is formed by compositing the two-dimensional conductive material film with the AgNw layer, the sheet resistance is substantially decreased, and the haze is substantially maintained at a comparative level to that of the AgNw layer. Accordingly, an exemplary embodiment of an electrode structure may be effectively used as a transparent electrode or the like.

The electrode structure may be used in the various fields, for example, for an electrode of a touch detecting sensor employed in the display device.

Hereinafter, an exemplary embodiment of a display device including a touch detecting sensor will now be described with reference to FIG. 4 to FIG. 7.

Figure 4:
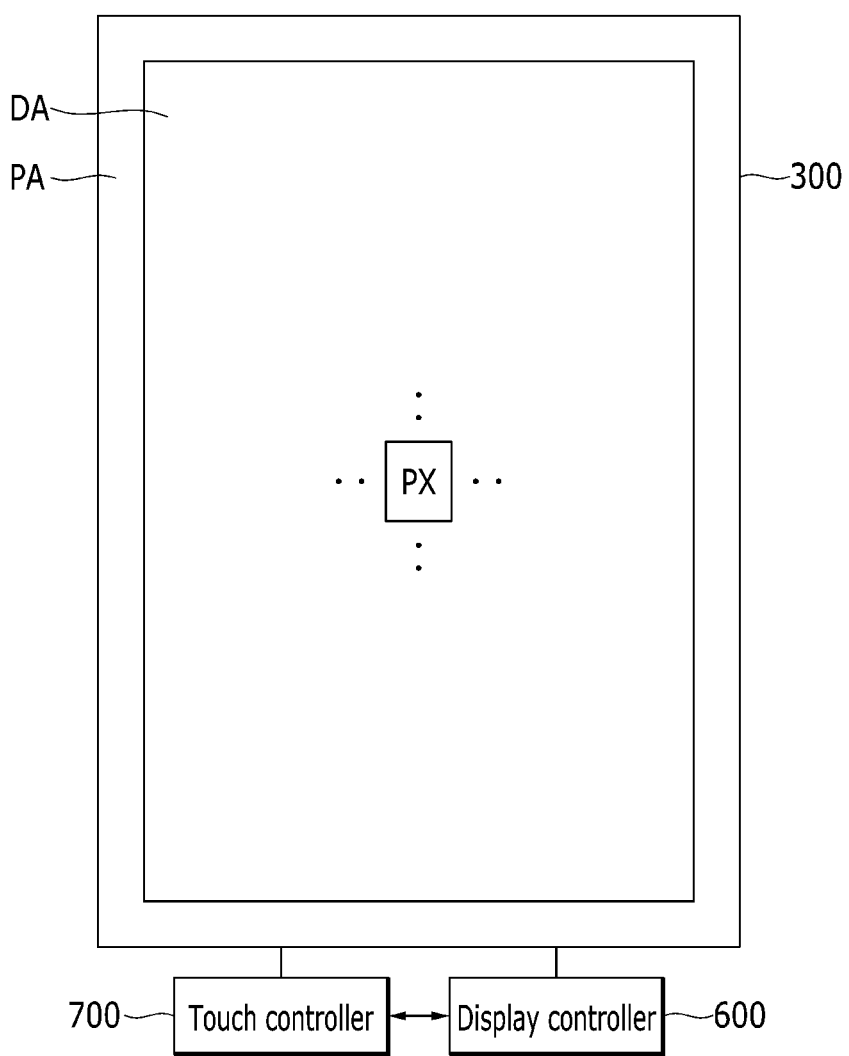
FIG. 4 is a block diagram showing an exemplary embodiment of a display device including a touch detecting sensor.
Figure 5:
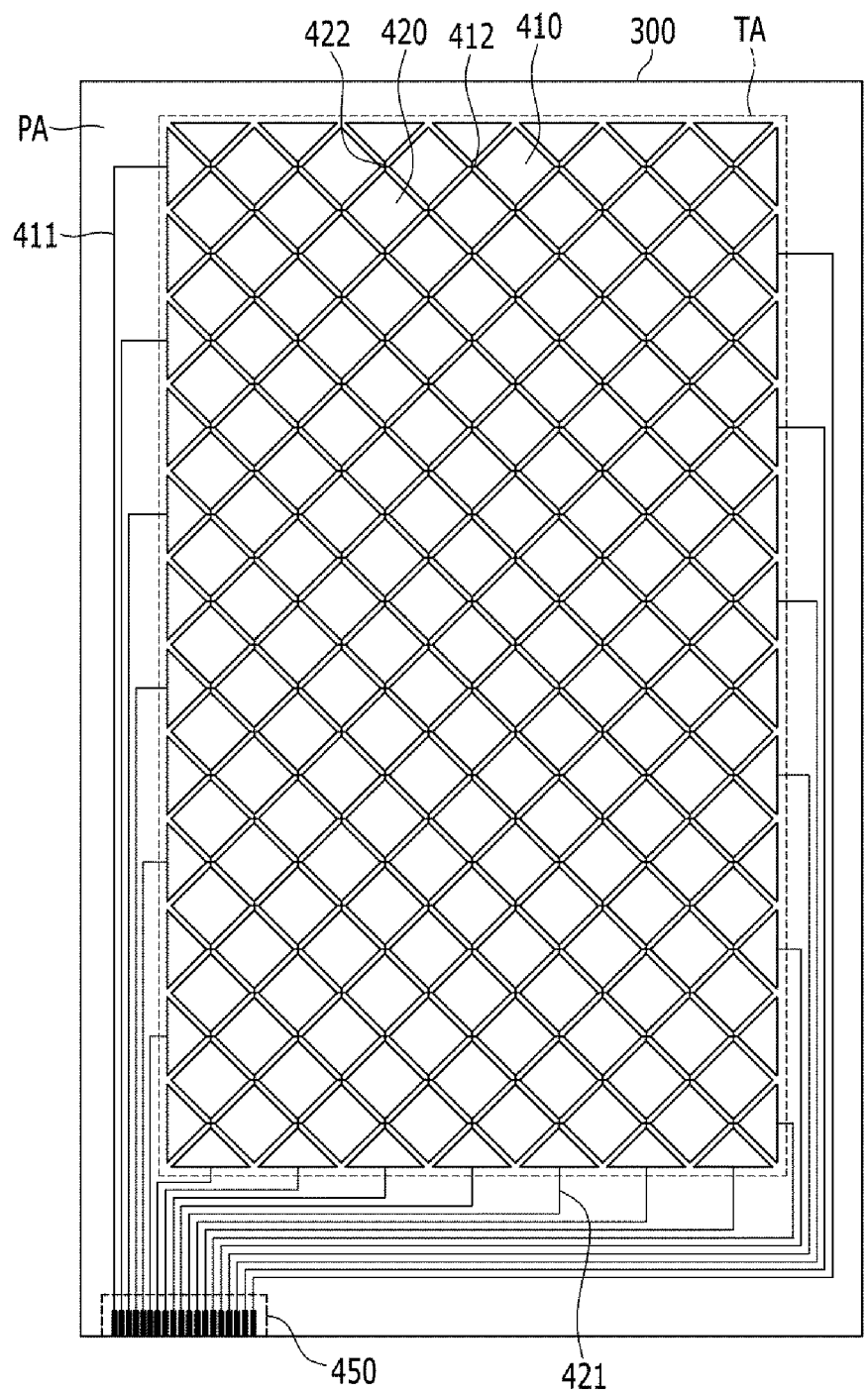
FIG. 5 is a top plan view showing an exemplary embodiment of a touch detecting sensor.
Figure 6:
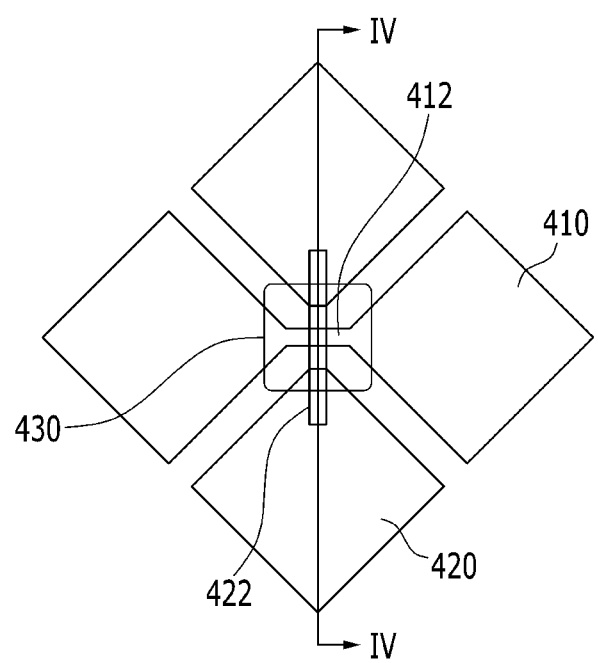
FIG. 6 is an enlarged view showing a part of the touch detecting sensor shown in FIG. 5.
Figure 7:
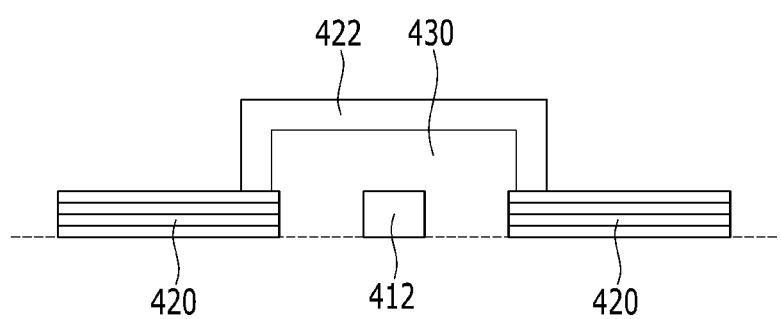
FIG. 7 is a cross-sectional view taken along line IV-IV of the touch detecting sensor shown in FIG. 6.

FIG. 4 is a block diagram showing an exemplary embodiment of a display device including a touch detecting sensor; FIG. 5 is a top plan view showing an exemplary embodiment of a touch detecting sensor; FIG. 6 is an enlarged view showing a part of the touch detecting sensor shown in FIG. 5; and FIG. 7 is a cross-sectional view taken along line IV-IV of the touch detecting sensor shown in FIG. 6.

Referring to FIG. 4, an exemplary embodiment of a display device including the touch detecting sensor includes a display panel 300, a display controller 600 connected to the display panel 300, and a touch controller 700.

The display panel 300 may display an image and detect a touch. The display panel 300 includes a display area DA for displaying an image and a peripheral area PA around the display area DA when viewed from a plan view (e.g., a top plan view as shown in FIG. 4).

In such an embodiment, a touch active area TA may be defined in a partial area or the entire area of display panel 300 for sensing a touch. The touch active area TA is an area, in which a touch is sensed when an object substantially approaches the display panel 300 or touches the display panel 300. Herein, the term 'touch' includes the case of having the external object approach the display panel 300 or hover in the approached state as well as the case of directly touching the external object such as a user's hand to the display panel 300.

In an exemplary embodiment, as shown in FIG. 5, almost the entire display area DA defines a touch active region TA, but is not limited thereto. In an alternative exemplary embodiment, a part of the peripheral area PA may also be used as a touch active area TA, and only a part of display area DA may be used as a touch active area TA.

Referring to FIG. 4, a plurality of pixels PX and a plurality of display signal lines (not shown) connected to the pixels PX and which transfers a driving signal are disposed in the display area DA.

The display signal line includes a plurality of scanning signal lines (not shown) for transferring a scan signal and a plurality of data lines (not shown) for transferring a data signal. The scanning signal line and the data line may extend in different directions from each other to cross each other. The display signal line may extend toward the peripheral area PA in which a pad part (not shown) is disposed.

In an exemplary embodiment, the plurality of pixels PX may be arranged substantially in a matrix form, but is not limited thereto. Each pixel PX may include a switch (not shown) connected to a gate line and a data line, and a pixel electrode (not shown) connected to the switch. The switch may be a three-terminal element, e.g., a thin film transistor, integrated with the display panel 300. The switch may be turned on or turned off in response to the gate signal transferred by the gate line to selectively transfer a data signal transferred by a data line to the pixel electrode. The pixel PX may further include an opposed electrode (not shown) opposed to the pixel electrode. In an exemplary embodiment of a display device, where the display device is the organic light emitting diode ("OLED") display, an emission layer is disposed between the pixel electrode and the opposed electrode, thereby defining a light emitting element. The opposed electrode may apply a common voltage.

Each pixel PX may express or display one of primary colors for expressing a color display, and desirable colors may be recognized by associating such primary colors. In one exemplary embodiment, for example, the primary colors may include three primary colors such as red, green and blue, or four primary colors. Each pixel PX is defined to correspond to each pixel electrode and may further include a color filter for expressing one of the primary colors, and the emission layer including a light emitting element may emit light having a predetermined color.

A touch detecting sensor is disposed in the touch active area TA. The touch detecting sensor may detect a touch thereon through various methods. In one exemplary embodiment, for example, the touch detecting sensor may be classified as a resistive type, a capacitive type, an electromagnetic ("EM") type, or an optical type according to the various methods.

Hereinafter, for convenience of description, an exemplary embodiment including a capacitive type of touch detecting sensor will be described in greater detail, but not being limited thereto.

Referring to FIG. 5, in an exemplary embodiment of a display device, the touch detecting sensor may include a plurality of touch electrodes, and the plurality of touch electrodes may include a plurality of first touch electrodes 410 and a plurality of second touch electrodes 420. The first touch electrode 410 is separated from the second touch electrode 420.

Referring to FIGS. 5 and 6, a plurality of first touch electrodes 410 and a plurality of second touch electrodes 420 are alternatively disposed and positioned to not overlap each other in the touch active area TA. The first touch electrodes 410 may be disposed along a first direction, e.g., a column direction, and a second direction, e.g., a row direction, and the second touch electrodes 420 may be disposed along the first direction and the second direction. Herein, the first and second directions cross each other (e.g., perpendicular to each other), and may be referred to as a horizontal direction and a vertical direction, respectively.

In such an embodiment, the first touch electrode 410 and the second touch electrode 420 may be disposed in the same layer.

In an exemplary embodiment, as shown in FIGS. 5 and 6, each of the first touch electrode 410 and the second touch electrode 420 may have a quadrangular shape, but is not limited thereto. In an alternative exemplary embodiment, the first touch electrode 410 and the second touch electrode 420 may have various shapes, for example, a shape having a protruding portion to improve sensitivity of the touch detecting sensor.

In an exemplary embodiment, the first touch electrodes 410 arranged in a same column or row may be connected to each other at the inside or the outside of the touch active area TA, or may be electrically separated from each other. In such an embodiment, at least some of the plurality of second touch electrodes 420 arranged in the same column or row may be connected to each other at the inside or the outside of touch active area TA or may be electrically separated from each other. In one exemplary embodiment, for example, as shown in FIG. 5, the first touch electrodes 410 arranged in a same row are connected to each other at the inside of the touch active area TA, and the second touch electrodes 420 arranged in a same column may be connected to each other at the inside of the touch active area TA.

In such an embodiment, the plurality of first touch electrodes 410 positioned in each row may be connected to each other through a first connection part 412, and the plurality of second touch electrodes 420 positioned in each column may be connected to each other through a second connection part 422.

Referring to FIG. 6 and FIG. 7, in an exemplary embodiment, a first connection part 412 connected between adjacent first touch electrodes 410 may be positioned on the same layer as the first touch electrode 410, and may include or be made of the same material as the first touch electrode 410. In such an embodiment, the first touch electrode 410 and the first connection part 412 may be integrated and may be simultaneously patterned.

The second connection part 422 connected between adjacent second touch electrodes 420 may be positioned on a different layer from that of the second touch electrode 420. In such an embodiment, the second touch electrode 420 and the first connection part 412 may be spaced apart from each other, and may be separately patterned. The second touch electrode 420 and the second connection part 422 may be connected to each other by direct contact.

A nonconductive layer 430 is disposed between the first connection part 412 and the second connection part 422 to insulate the first connection part 412 and the second connection part 422 from each other. The nonconductive layer 430 may include a plurality of independent island insulators disposed at every crossing region of the first connection part 412 and the second connection part 422, as shown in FIG. 6 and FIG. 7

The nonconductive layer 430 may expose at least a part of the second touch electrode 420 to connect the second connection part 422 with the second touch electrode 420.

The insulation layer 430 may have a round edge or may have a polygonal edge.

According to another exemplary embodiment, the insulation layer 430 is disposed substantially on the entire touch active area TA, and a hole may be defined in the insulation layer 430 at a part of the second touch electrode 420 to connect the adjacent second touch electrodes 420 in a column direction.

In an alternative exemplary embodiment, the second connection part 422 for connecting the adjacent second touch electrodes 420 to each other may be positioned in the same layer as the first touch electrode 410 and may be integrated with the first touch electrode 410, and the first connection part 412 for connecting the adjacent first touch electrodes 410 to each other may be positioned in the different layer from that of the first touch electrode 410.

Referring to FIG. 5, the first touch electrodes 410 connected to each other in each row are connected to a touch controller 700 through a first touch wire 411, and the second touch electrodes 420 connected to each other in each column may be connected to the touch controller 700 through a second touch wire 421. In an exemplary embodiment, the first touch wire 411 and the second touch wire 421 may be positioned in the peripheral area PA of the display panel 300, as shown in FIG. 5, but not being limited thereto. In an alternative exemplary embodiment, the first touch wire 411 and the second touch wire 421 may be positioned in the touch active area TA.

The terminal end of the first touch wire 411 and the second touch wire 421 may define a pad part 450 in the peripheral area PA of display panel 300.

The first touch electrode 410 and the second touch electrode 420 may have a transmittance equal to or greater than a predetermined transmittance to allow light from the display panel 300 to transmit therethrough. The first touch electrode 410 and the second touch electrode 420 may include an electrode structure in which a conductive layer (e.g., one or more conductive layer) including a two-dimensional conductive material and a conductive layer including at least one conductive material of a two-dimensional conductive material, an AgNw, a metal mesh, a CNT, graphene, and the like are alternately stacked with a plurality of nonconductive layers therebetween.

In such an embodiment, the nonconductive layer may be an organic binder used for coating liquid-phase AgNw, a CNT, graphene, or the like. The organic binder may include a cellulose-based binder such as HPMC, polyvinyl alcohol, polyvinyl acrylic acid, or the like. In such an embodiment, the uppermost nonconductive layer may be a polyacrylate-based overcoating layer. The plurality of conductive layers may include a conductive layer including a conductive material such as a two-dimensional conductive material, an AgNw, a metal mesh, a CNT, and graphene, and a conductive layer including a two-dimensional conductive material, and each layer may include a different kind of conductive material. In one exemplary embodiment, for example, the two-dimensional conductive material may be mixed with a binder and coated (e.g., wet-coated) and dried to provide a first conductive layer positioned in the lowermost layer of the conductive layers, then an AgNw may be mixed with an organic binder and coated (e.g., wet-coated) thereon and dried to provide a second conductive layer including an AgNw and an nonconductive layer including an organic binder, and a CNT or graphene may be mixed with an organic binder and coated (e.g., wet-coated) and dried to provide a third conductive layer including a CNT or graphene and an nonconductive layer including an organic binder. The organic binder may be disposed on the surface of either a CNT or graphene to provide a nonconductive layer on the third conductive layer. The plurality of conductive layers may be electrically connected to each other through a connecting member disposed on a side surface of the electrode structure. Referring back to FIG. 5, according to an exemplary embodiment, the second connection part 422 for connecting between the second touch electrodes 420 may define a connecting member that connects a plurality of conductive layers of the electrode structure on the side surface thereof. In an exemplary embodiment, the first touch wire 411 and the second touch wire 421 may defined connecting members that connect a plurality of conductive layers of the electrode structure, and may be disposed on the side surface thereof. In an alternative exemplary embodiment, the connecting member may be provided separately from the second connection part 422, the first touch wire 411 and the second touch wire 421.

The first touch wire 411 and the second touch wire 421 may include the transparent conductive material included in the first touch electrode 410 and the second touch electrode 420, or a low resistance material such as molybdenum (Mo), silver (Ag), titanium (Ti), copper (Cu), aluminum (Ti), molybdenum/aluminum/molybdenum (Mo/Al/Mo) or a combination thereof.

The adjacent first touch electrode 410 and second touch electrode 420 may define a mutual sensing capacitor that functions as a touch detecting sensor. The mutual sensing capacitor may receive the detection input signal through one of the first touch electrode 410 and the second touch electrode 420, and may output the charge change due to a touch thereon by the external object as a detection output signal through the remaining touch electrode.

In an alternative exemplary embodiment, a plurality of first touch electrodes 410 and a plurality of second touch electrodes 420 may be separated from each other and may each be connected to a touch controller 700 through a touch wire (not shown). In such an embodiment, each touch electrode may define a self-sensing capacitor as a touch detecting sensor. The self-sensing capacitor may be charged in a predetermined column when the detection input signal is received, and the charge of the column may be changed when it is touched by the external object such as a finger, to thereby discharge the detection output signal that is different from the received detection input signal.

Referring back to FIG. 4, the display controller 600 controls an image display operation of the display panel 300.

In an exemplary embodiment, the display controller 600 receives an input video signal including luminance information of each pixel PX and an input control signal for controlling the display of the input video signal from the outside. The display controller 600 processes the input video signal based on the input video signal and the input control signal, such that the display controller 600 converts the input video signal into the output video signal and generates a control signal such as a gate control signal and a data control signal. The display controller 600 sends the gate control signal to the gate driver (not shown), and sends the data control signal and the output video signal to the data driver (not shown).

In an exemplary embodiment, the data driver receives the output video signal for one column pixel PX based on the data control signal, converts the output video signal into the data voltage by selecting a gray voltage corresponding to each output video signal, and then applies the selected gray voltage to the corresponding data line. In such an embodiment, the gate driver applies a gate-on-voltage to a gate line according to the gate control signal to turn on a switch connected to the gate line such that the data voltage applied to the data line is applied to the corresponding pixel PX through the turned-on switch. When the data voltage is applied to the pixel PX, the pixel PX may express luminance corresponding to the data voltage by various optical converters such as a light emitting element.

The touch controller 700 is connected to a touch detecting sensor positioned in the touch active area to control the operation of the touch detecting sensor. The touch controller 700 may be operated by transmitting the detection input signal to the touch detecting sensor or receiving the detection output signal. The touch controller 700 operates the detection output signal to generate touch information such as occurrence and position of a touch thereon.

The driving device, such as a data driver, a gate driver and a display controller 600, may be mounted directly on the display panel 300 as a form of an integrated circuit ("IC") chip or may be mounted on a flexible printed circuit film (not shown) to be attached onto the display panel 300 as a form of a tape carrier package ("TCP"), or may be mounted on an additional printed circuit board (not shown). Alternatively, the driving device may be integrated to a display panel 300 together with a display signal line and a switch or the like.

The touch controller 700 may also be mounted directly on the display panel 300 as a form of an IC chip or may be mounted on the flexible printed circuit film to be attached onto the display panel 300 as a form of a TCP, or may be mounted on the additional printed circuit board. The touch controller 700 may be connected to the first touch wire 411 and second touch wire 421 through the pad part 450 of display panel 300.

While the operative principle has been described in connection with what is presently considered to be practical exemplary embodiments, it is to be understood that the inventive scope is not limited to the disclosed embodiments, but, on the contrary, is intended to cover various modifications and equivalent arrangements included within the spirit and scope of the appended claims.

What is claimed is:

1. A display device, comprising an electrode structure, wherein the electrode structure comprises:
   a first conductive layer;
   a second nonconductive layer disposed on the first conductive layer; and
   a second conductive layer disposed on the second nonconductive layer and made of a different material from the first conductive layer;
   wherein the first conductive layer comprises a $RuO_2$ layer having thickness equal to or less than 10 nm,
   wherein the second conductive layer comprises a silver nanowire,
   wherein at least a part of the silver nanowire of the second conductive layer or the $RuO_2$ layer of the first conductive layer is extended to and disposed in the second nonconductive layer,
   wherein the second nonconductive layer is disposed between the first conductive layer and the second conductive layer,
   wherein the second nonconductive layer comprises a binder, which is mixed with the silver nanowire of the second conductive layer and the $RuO_2$ layer of the first conductive layer.

2. The display device of claim 1, further comprising a first nonconductive layer under the first conductive layer and wherein
   the first nonconductive layer comprises the binder wet-coated with one of the silver nanowire and the $RuO_2$ layer.

3. The display device of claim 2, wherein the electrode structure further comprises:
   an anti-reflection coating disposed between the first conductive layer and the second conductive layer,
   wherein the anti-reflection coating has a refractive index in a range of about 1.6 to about 1.8 and a thickness in a range of about 75 nanometers to about 95 nanometers.

4. The display device of claim 2, wherein the third nonconductive layer comprises:
   a lower layer comprising the binder; and
   an overcoat layer comprising a polyacrylate-based material.

5. The display device of claim 1, wherein the electrode structure further comprises:
   a third conductive layer disposed on the third nonconductive layer and a fourth nonconductive layer disposed on the third conductive layer.

6. The display device of claim 5, wherein
   the third conductive layer comprises a two-dimensional conductive material, a silver nanowire, a carbon nanotube, graphene or a combination thereof, and
   the fourth nonconductive layer comprises a binder which is wet-coated with the conductive material of the third conductive layer.

7. The display device of claim 6, wherein the fourth nonconductive layer comprises:
   a lower layer comprising the binder; and
   an overcoat layer comprising a polyacrylate-based material.

8. The display device of claim 1, further comprising:
   a conductive connector disposed on a side surface of a stacking structure comprising the first nonconductive layer, the first conductive layer, the second nonconductive layer, the second conductive layer and the third nonconductive layer,
   wherein the conductive connector is electrically connected to the first conductive layer and the second conductive layer.

9. The display device of claim 8, wherein
   the conductive connector comprises the conductive material of the first conductive layer or the second conductive layer, molybdenum (Mo), silver (Ag), titanium (Ti), copper (Cu), aluminum (Al), molybdenum/aluminum/molybdenum (Mo/Al/Mo) or a combination thereof.

10. The display device of claim 1, further comprising
    a third nonconductive layer disposed on the second conductive layer,
    wherein
    the third nonconductive layer comprises the binder wet-coated with one of the silver nanowire and the $RuO_2$ layer.

11. A touch detecting sensor comprising:
    a plurality of first touch electrodes arranged in a first direction;
    a plurality of second touch electrodes arranged in a second direction crossing the first direction; and
    a touch controller connected to the plurality of first touch electrodes and the plurality of second touch electrodes, wherein the touch controller applies a detection input signal, and receives a detection output signal to sense a touch on the first and second touch electrodes,
    wherein
    each of the first touch electrodes and the second touch electrodes comprises a stacking structure in which a plurality of conductive layers and a plurality of nonconductive layers are alternately stacked one on another,
    the conductive layers comprise:
      a first conductive layer comprising a $RuO_2$ layer having thickness equal to or less than 10 nm; and
      a second conductive layer comprising a silver nanowire,
    at least a part of the silver nanowire of the second conductive layer, or the $RuO_2$ layer of the first conductive layer is extended to and disposed in a nonconductive layer interposed between the first conductive layer and the second conductive layer,
wherein the nonconductive layer comprises a binder which is mixed with the silver nanowire of the second conductive layer and the $RuO_2$ layer of the first conductive layer.

12. The touch detecting sensor of claim 11, further comprising:
a conductive connector disposed on a surface of the stacking structure,
wherein the conductive connector is electrically connected to the conductive layers.

13. The touch detecting sensor of claim 12, wherein
the conductive connector covers a part of an upper surface of the stacking structure and a side surface of the stacking structure.

14. The touch detecting sensor of claim 12, wherein
the conductive connector is connected to a wire which connects the plurality of first touch electrodes and the plurality of second touch electrodes to the touch controller.

15. The touch detecting sensor of claim 12, wherein
the first touch electrodes and the second touch electrodes are flexible.

* * * * *